(12) United States Patent
Peterson et al.

(10) Patent No.: US 7,355,859 B2
(45) Date of Patent: Apr. 8, 2008

(54) DC POWER PORT IN A RACK

(75) Inventors: Martha G. Peterson, McKinney, TX (US); Eric C. Peterson, McKinney, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 406 days.

(21) Appl. No.: 11/074,411

(22) Filed: Mar. 8, 2005

(65) Prior Publication Data
US 2006/0203433 A1   Sep. 14, 2006

(51) Int. Cl.
*H05K 5/00*   (2006.01)
(52) U.S. Cl. ...................... 361/724; 361/697
(58) Field of Classification Search ............... 361/679, 361/724–727
See application file for complete search history.

(56) References Cited

U.S. PATENT DOCUMENTS

| | | | |
|---|---|---|---|
| 6,801,428 B2* | 10/2004 | Smith et al. ................ | 361/687 |
| 6,836,030 B2* | 12/2004 | Smith et al. ................ | 307/147 |
| 6,867,966 B2* | 3/2005 | Smith et al. ................ | 361/687 |
| 6,909,611 B2* | 6/2005 | Smith et al. ................ | 361/727 |
| 7,196,900 B2* | 3/2007 | Ewing et al. ............... | 361/642 |
| 2004/0016708 A1* | 1/2004 | Rafferty et al. ............. | 211/26 |
| 2004/0059903 A1* | 3/2004 | Smith et al. ................ | 713/1 |
| 2004/0189161 A1* | 9/2004 | Davis et al. ............. | 312/265.3 |
| 2005/0050272 A1* | 3/2005 | Behrens et al. ............ | 711/114 |
| 2005/0078422 A1* | 4/2005 | Pincu et al. ................ | 361/62 |
| 2005/0168932 A1* | 8/2005 | Selvidge et al. ........... | 361/685 |

OTHER PUBLICATIONS

P. H. Potega, "Standards And Specs For In-Seat Power On Aircraft Still In The Clouds," Electronic Design, Feb. 9, 1998, Analog Outlook, 10 pp. [Online] http://www.elecdesign.com/Globals/PlanetEE/Content/1522.html.
ARINC Industry Activities, Seat Integration Working Group (SIWG), Oct. 6, 2004, 2 pp., [Online] http://www.arinc.com/aeec/projects/siwg/index.html.
Energy Technologies, Inc., "Naval Surface Warfare Center Control System," Copyright 1991-2004 Energy Technologies, Inc., last updated Oct. 26, 2004, 7 pp. [Online] http://www.911power.com/01-1235.htm.
EmPower, "15 Volt DC and 110 volt AC In-Seat Power," 3 pp.
CompuBahn Electronics, "Tripp-Lite Waber Rackmount Power Strip R-1215/903CCB15," Copyright 2004, 2 pp. [Online] http://thecompubahn.zoovv.com/product.TRIPPLITE_RS_1215.

* cited by examiner

*Primary Examiner*—Lisa Lea-Edmonds

(57) ABSTRACT

A direct current (DC) power port is included in a rack to provide DC power to electrical equipment external to the rack.

19 Claims, 5 Drawing Sheets

DC POWER PORT IN A RACK

BACKGROUND

As the complexity of computer data centers has increased, so has the complexity of the tools used by field service technicians working in the data centers. Data centers often include one or more racks of equipment (servers, storage devices, etc.) that the technician services. Technicians often need to perform a wide variety of diagnostic tests on such equipment. Many vendors have opted to implement their test tools in software running on laptop computers with conventional operating systems (e.g., Microsoft Windows). A laptop computer usable as a test device allows the technician to have many of the necessary diagnostic tools at his or her disposal on a single hardware platform, thus avoiding the need to transport multiple pieces of test equipment to the customer site.

A laptop computer, however, requires a power source to operate. Although a data center would seem to be a place where alternating current (AC) power outlets would be plentiful, such outlets are not always available where needed by the technician. For example, although an equipment rack may have more than one AC outlet, the outlets may be located within the rack and blocked by electrical cables and thus difficult to access by the technician. Those AC outlets that are easily accessible may all already be in use for other reasons. The technician could run his service laptop computer on battery power, but doing so limits the time for which the technician can use the laptop.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
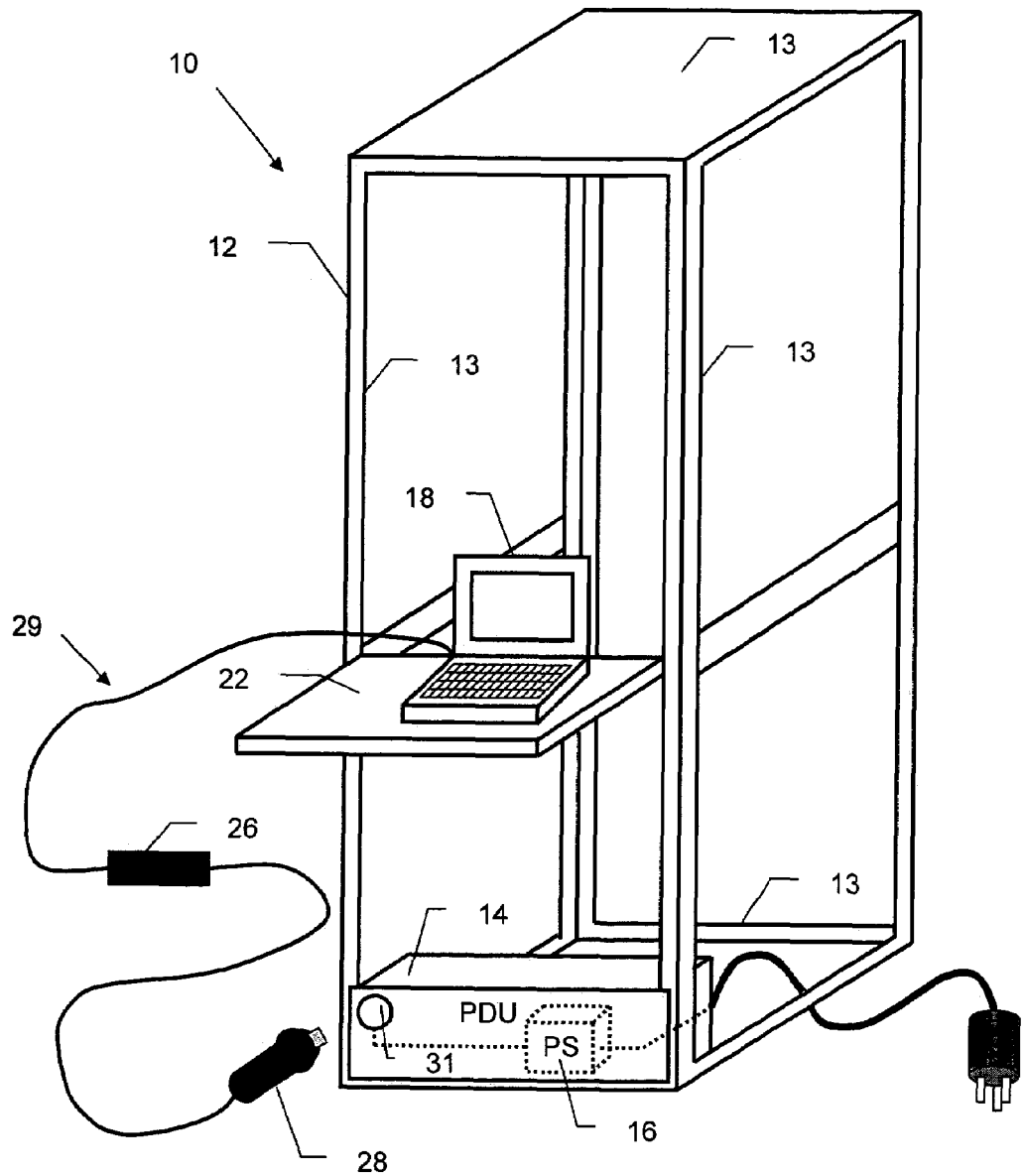
FIG. 1 shows a direct current (DC) power supply and power port integrated into a power distribution unit (PDU) constructed in accordance with at least some embodiments of the invention.

Referring now to FIG. 1, a system 10 is shown in accordance with an embodiment of the invention. In the embodiment shown in FIG. 1, system 10 comprises an equipment rack 12. The equipment rack 12 comprises one or more structural support members 13 joined together. The rack 12 is capable of accommodating one or more electrical devices. Such electrical devices may comprise one or more of a computer (e.g., a server), a storage device, and a network interface. In general, the equipment rack 12 may accommodate a plurality of electrical devices. In the embodiment shown, system 10 includes an alternating current (AC) power distribution unit (PDU) 14 mounted at the bottom of rack 12, although the AC PDU 14 can be mounted in other locations within the rack 12. The AC power distribution unit 14 receives and distributes AC power to one or more other devices (e.g., computers) within the rack. The AC PDU 14 also comprises a direct current (DC) power supply 16 which converts input AC power to DC output power. The DC output power from the DC power supply 16 is provided to a DC power port 31. An electrical device 18 receives operational power via the DC power port 31. The voltage level of DC power port 31 is application specific and thus can be customized as needed. Exemplary voltage levels include 5 VDC, 15 VDC, and 18 VDC. Multiple DC voltage levels can be provided to DC power port 31 via power supply 16 thereby permitting multiple different DC voltage levels to be used.

As shown in FIG. 1, the electrical device 18 comprises a laptop computer, although in other embodiments the electrical device 18 can be other types of electrical equipment. The electrical device 18 may comprise a piece of diagnostic equipment to be used to troubleshoot and/or repair a problem with an electrical device within the rack 12. The electrical device 18 plugs into the DC power port 31 via cable 29. Cable 29 may include a DC-to-DC converter 26 and an electrical connector 28. The electrical connector 28 may comprise an automobile cigarette lighter type of connector or an aircraft in-seat power connector. The DC power port comprises a connector suitable to mate with connector 28. In the examples in which connector 28 is an automobile cigarette lighter connector or an aircraft in-seat power connector, the DC power port comprises either an automobile cigarette lighter receptacle or an aircraft in-seat power receptacle.

System 10 also comprises a support member 22 on which the electrical device 18 is supported when in use. The support member 22 may comprise a tray. Further, the support member 22 may comprise a tray that slides in and out of the rack 12 and can thus slide out of the rack to support the electrical device 18 as shown. In the embodiment of FIG. 1, the DC power supply 16 is provided in the AC power distribution unit 14. The DC power port 31 is provided on an exterior surface of the AC power distribution unit 14. Moreover, the DC power port 31 is accessible by an electrical device (e.g., device 18) located outside the rack.

Figure 2:
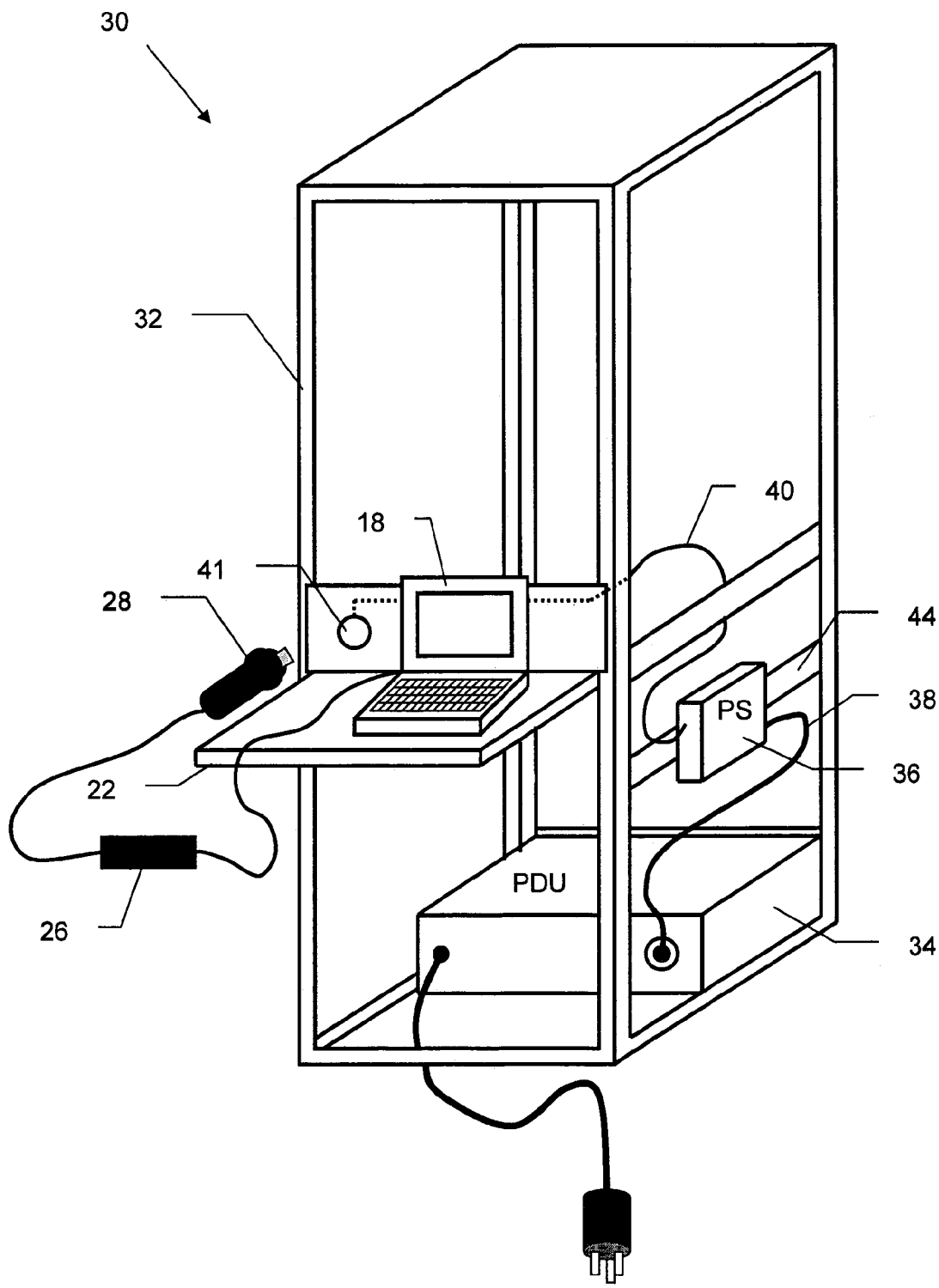
FIG. 2 shows a DC power supply and power port external to a PDU and integrated into an equipment cabinet in accordance with another embodiment of the invention.

Referring now to FIG. 2, a system 30 is shown comprising a rack 32 in which an AC PDU 34 and a DC power supply 36 are shown. Whereas in FIG. 1 the DC power supply 16 was provided within the AC PDU 14, in the embodiment of FIG. 2, the DC power supply 36 is separate from the AC PDU unit 34. The DC power supply 36 of FIG. 2 is mounted on a support member (e.g., a side rail) 44 of the rack 32. Electrical cable 38 provides AC power from the AC PDU 34 to the DC power supply 36. The DC power supply 36 connects to a DC power port 41 by way of cable 40. The DC power port 41 is shown at a location at support member 22. Being located "at the support member 22" means that the DC power port 41 is located on or in an area adjacent the support member 22. In some embodiments, the power port 41 is located on the support member, while in other embodiments, such as that shown in FIG. 1, the power port is sufficiently close to the support member that the electrical device 18 can be plugged into the port. As indicated previously, the power port 41 may comprise an automobile cigarette lighter receptacle or an aircraft in-seat power receptacle and is accessible to a device located outside rack 32.

As for the power port 31 of FIG. 1, the power port 41 of FIG. 2 is provided with a desired DC voltage level, or multiple DC voltage levels. Examples of suitable voltage levels include 5 VDC, 15 VDC, and 18 VDC. Further, the power port 41 of FIG. 2 can be implemented as an automobile cigarette lighter receptacle or an aircraft in-seat power receptacle or whatever connector type mates with the connector from the electrical device 18.

Figure 3:
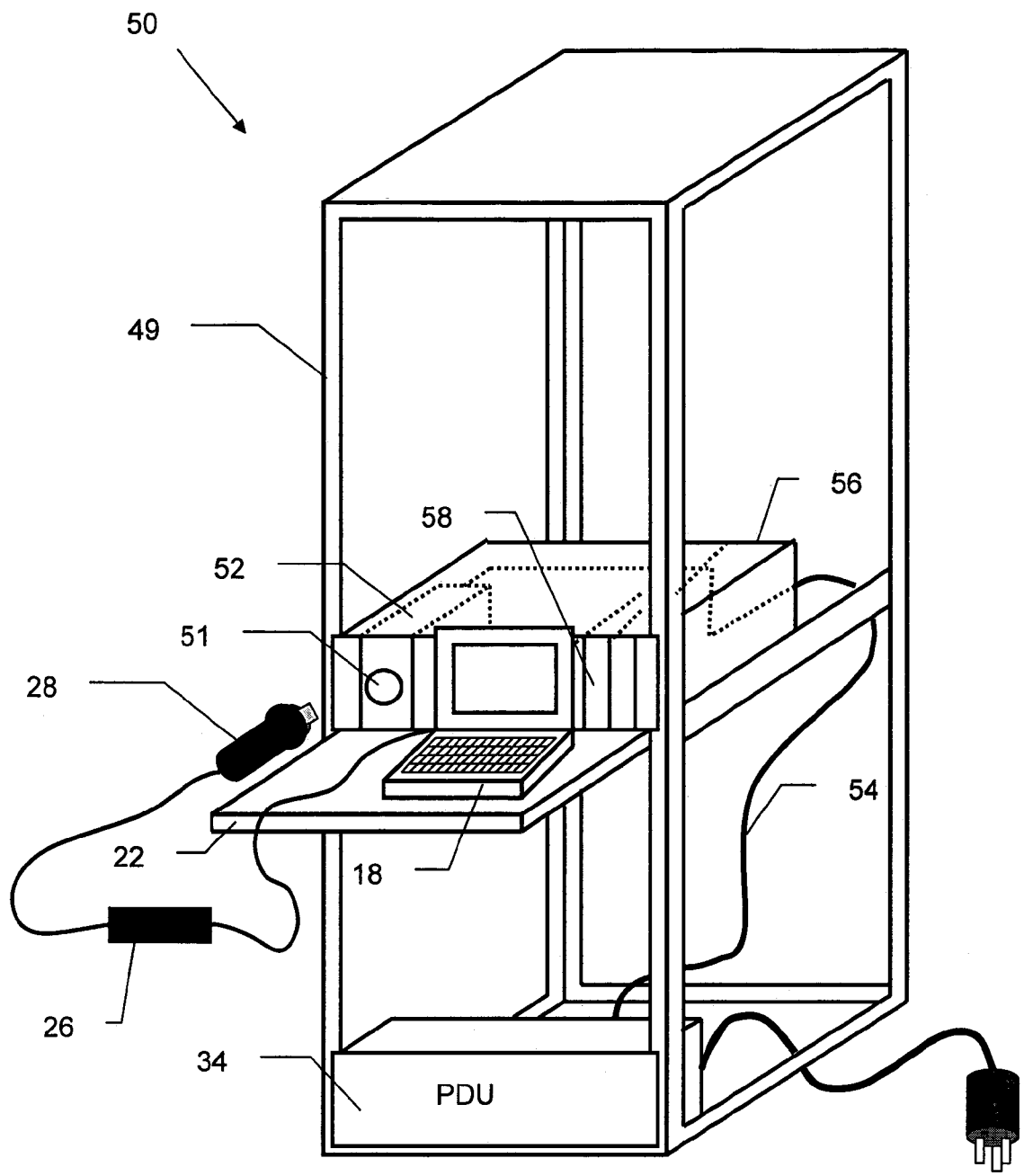
FIG. 3 shows a DC power supply and power port integrated into a plug-in module in accordance with yet another embodiment of the invention.

FIG. 3 shows a system 50 that comprises an AC PDU 34 and a chassis 56 mounted in a rack 49. The AC PDU 34 functions as indicated above with regard to the AC PDU 34 in FIGS. 1 and 2. The chassis 56 comprises an enclosure that includes one or more slots 58 into which electrical components can be inserted. Such electrical components may comprise blade servers, storage devices, network interfaces, etc. In the embodiment of FIG. 3, at least one of the slots is used to accommodate a DC power supply module 52. The DC power supply module 52 receives AC power via cable 54 interconnecting the AC power distribution unit 34 to the slot in which the DC power supply module 52 is inserted. The DC power supply module 52 converts the received AC power to a suitable DC voltage level and provides DC power to power port 51 which is accessible from an area external to the rack 49. As such, the electrical device 18 can connect to the DC power port 51 to provide operational power for the device 18. The specifics as to voltage levels, connector types, and location relative to the support member listed above with regard to power ports 31 and 41 also apply to power port 51.

Figure 4:
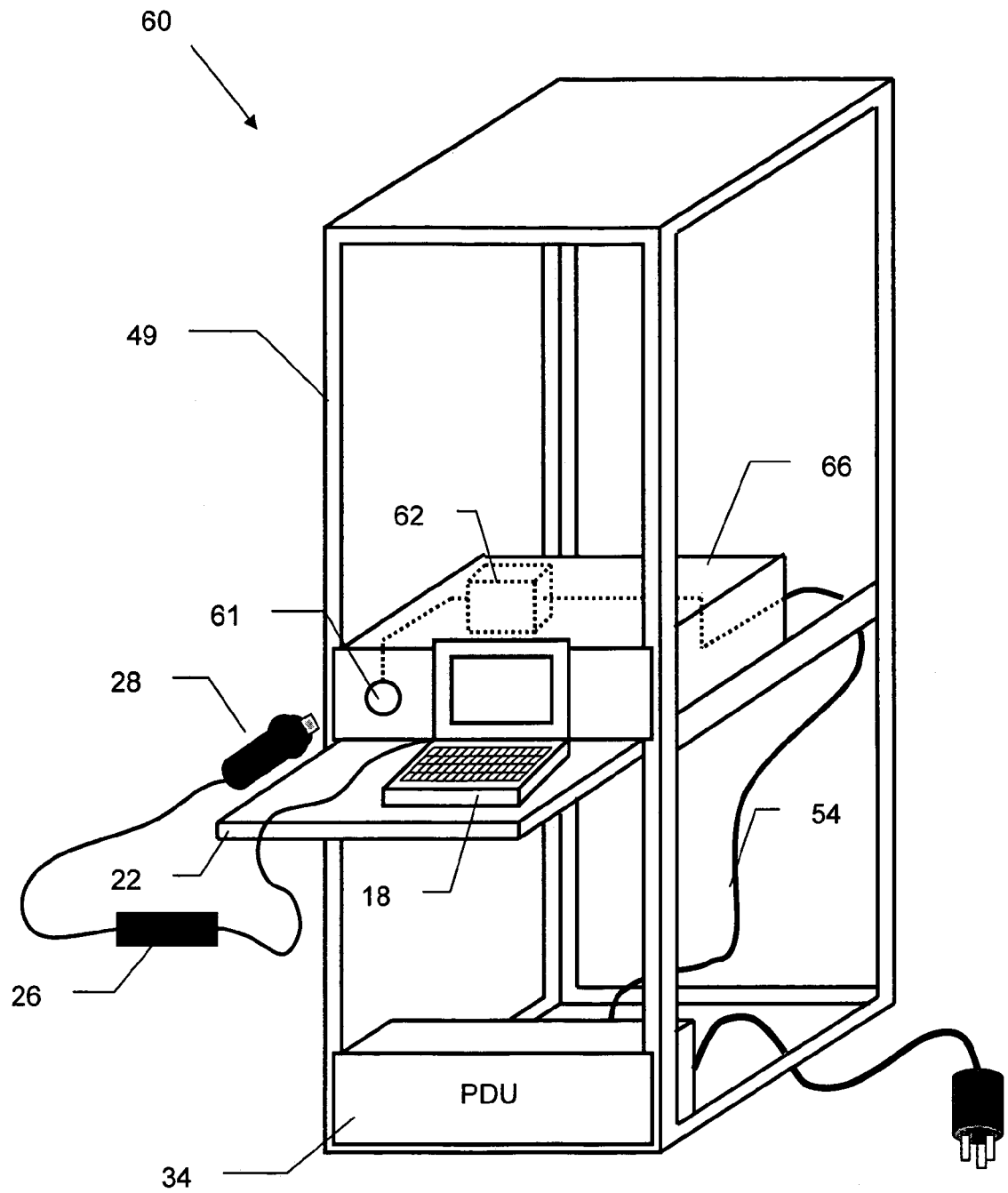
FIG. 4 shows a DC power supply and power port integrated into a computer in accordance with another embodiment of the invention.

Referring now to FIG. 4, a system 60 is shown comprising an AC PDU 34 (described above) and a computing system 66. In the embodiment of FIG. 4, computing system 66 comprises a server, although in other embodiments, system 66 may comprise other types of systems. A DC power supply 62 is provided within system 66 to convert AC power received via cable 54 to a suitable DC power level for DC power port 61. Again, the specifics as to voltage levels, connector types, and location relative to the support member listed above with regard to power ports 31 and 41 also apply to power port 61.

Figure 5:
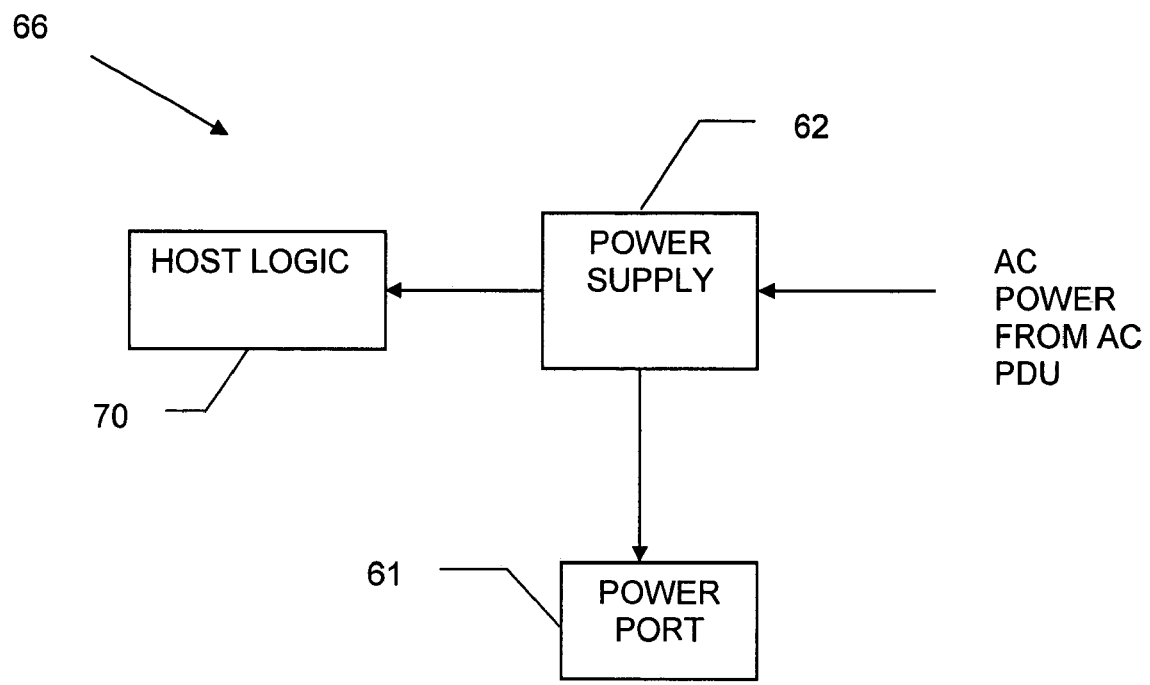
FIG. 5 shows an embodiment of the computer of FIG. 4.

Referring to FIG. 5, an exemplary embodiment is shown of system 66. As shown, system 66 comprises the DC power supply 62 noted above which receives AC power from the AC PDU 34 and provides DC operational power both to host logic 70 and to the DC power port 61. The host logic 70 in FIG. 5 may comprise a central processing unit (CPU), memory, and other devices typical of a computer. The power port 61 in the computer embodiment of FIGS. 4 and 5 is adapted to provide power, but not data, to equipment external to the rack. Moreover, the power ports described above with regard to the embodiments of FIGS. 1-3 also do not provide data to external equipment.

By providing a readily accessible DC power port, a source of power is readily available when and where needed. By implementing the power port as a DC power port, rather than a standard AC wall outlet type of receptacle, the probability is increased that, when needed, the DC power port will be available for use.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system, comprising:
    a rack;
    a direct current (DC) power supply mounted in said rack; and
    a DC power port is mounted on an outer surface of said rack and receiving DC power from said DC power supply;
    wherein said DC power port is adapted to provide DC power to an electrical device external to said rack.

2. The system of claim 1 wherein the DC power port comprises an automobile cigarette lighter receptacle.

3. The system of claim 1 wherein the DC power port comprises an aircraft in-seat power receptacle.

4. The system of claim 1 further comprising a device supported in said rack, said device selected from a group consisting of a computer, a storage drive, and a network interface.

5. The system of claim 1 further comprising an alternating current (AC) power distribution unit mounted in said rack and providing AC power to said DC power supply.

6. The system of claim 5 wherein the DC power supply is located within said AC power distribution unit.

7. The system of claim 1 further comprising a support member on which said electrical device rests.

8. The system of claim 7 wherein said support member comprises a slidable tray.

9. The system of claim 7 wherein said power port is located at said support member.

10. The system of claim 9 wherein said power port is located on said support member.

11. An system, comprising:
    a rack comprising a plurality of slots into which equipment can be installed, wherein said slots are adapted to accept a device selected from a group consisting of a computer, a storage device, and a network interface, and
    at least one of said slots accepts a module that includes a direct current (DC) power port and a power supply that converts alternating current (AC) power to DC power;
    wherein said DC power port receives said DC power from said power supply; and
    wherein said DC power port is accessible from outside of said rack via said slot in which said DC power port is included, and wherein said DC power port can be used to provide DC power to electrical equipment external to said rack.

12. The system of claim 11 wherein the DC power port comprises an automobile cigarette lighter receptacle.

13. The system of claim 11 wherein the DC power port comprises an aircraft in-seat power receptacle.

14. The system of claim 11 further comprising equipment external to said rack, said equipment receives DC power via an electrical cable between said external equipment and said DC power port.

15. The system of claim 14 further comprising a tray on which said external electrical equipment can be placed, wherein said DC power port is mounted at said tray.

16. The system of claim 15 wherein the DC power port is mounted on said tray.

17. A computer, comprising:
host logic;
a power supply that receives alternating current (AC) power and converts said AC power to DC power usable to operate the host logic; and
a DC power port on an exterior surface of said computer, said DC power port receiving DC power from said power supply;
wherein said computer is adapted to be mounted in a rack; and
wherein said DC power port is usable to provide DC power to a device external to said rack, but not usable to provide data to said device.

18. The computer of claim 17 wherein the DC power port comprises an automobile cigarette lighter receptacle.

19. The computer of claim 17 wherein the DC power port comprises an aircraft in-seat power receptacle.

* * * * *

UNITED STATES PATENT AND TRADEMARK OFFICE
CERTIFICATE OF CORRECTION

| | | |
|---|---|---|
| PATENT NO. | : 7,355,859 B2 | Page 1 of 1 |
| APPLICATION NO. | : 11/074411 | |
| DATED | : April 8, 2008 | |
| INVENTOR(S) | : Martha G. Peterson et al. | |

It is certified that error appears in the above-identified patent and that said Letters Patent is hereby corrected as shown below:

In column 5, line 12, in Claim 15, delete "claim 14" and insert -- claim 11 --, therefor.

Signed and Sealed this

Nineteenth Day of August, 2008

JON W. DUDAS
*Director of the United States Patent and Trademark Office*